United States Patent [19]

Soth et al.

[11] Patent Number: 5,105,528
[45] Date of Patent: Apr. 21, 1992

[54] METHOD AND APPARATUS FOR SUPPLYING AND CHANGING TIPS OF A PICK AND PLACE VACUUM SPINDLE

[75] Inventors: Henry J. Soth, Brackney, Pa.; Jack A. Kinback, Binghamton, N.Y.

[73] Assignee: Universal Instruments Corporation, Binghamton, N.Y.

[21] Appl. No.: 644,035

[22] Filed: Jan. 22, 1991

[51] Int. Cl.⁵ .......................... B23Q 3/155
[52] U.S. Cl. ........................ 29/568; 29/740; 901/41
[58] Field of Search ........... 29/568, 740; 408/35; 901/41, 30

[56] References Cited

U.S. PATENT DOCUMENTS

| | | | |
|---|---|---|---|
| 3,074,147 | 1/1963 | Miller | 279/1.75 |
| 3,191,260 | 6/1965 | Jorgensen | 29/568 X |
| 3,203,017 | 8/1965 | Hölzl | 29/568 X |
| 3,780,406 | 12/1973 | Cupler et al. | 29/26 A |
| 3,999,769 | 12/1976 | Bayer et al. | 29/26 A X |
| 4,103,405 | 8/1978 | Blum et al. | 29/26 A |
| 4,204,303 | 5/1980 | Eidam | 29/26 A |
| 4,419,797 | 12/1983 | Sigloch et al. | 29/26 A |
| 4,561,415 | 12/1985 | Willot | 408/35 |
| 4,563,800 | 1/1986 | Bonga | 29/26 A |
| 4,620,347 | 11/1986 | Stark et al. | 29/26 A |
| 4,649,610 | 3/1987 | Onishi et al. | 29/26 A |
| 4,741,078 | 5/1988 | Kimura | 29/39 |
| 4,831,721 | 5/1989 | Hirai et al. | 29/568 |

FOREIGN PATENT DOCUMENTS

| | | | |
|---|---|---|---|
| 61-79538 | 4/1986 | Japan | 29/568 |
| 228200 | 9/1989 | Japan | 29/568 |
| 292898 | 11/1989 | Japan | 29/568 |
| 1315222 | 6/1987 | U.S.S.R. | 901/41 |

Primary Examiner—William Briggs
Attorney, Agent, or Firm—Wegner, Cantor, Mueller & Player

[57] ABSTRACT

A vacuum spindle for picking and placing components is operatively associated with a turret assembly which carries a supply of various component engaging tips for the spindle in corresponding holes or chambers of the turret. During picking and placing of the components, the spindle extends through the turret chamber from which the tip of the spindle was acquired. In order to exchange tips, the spindle is retracted to a first position at which the tip may be relocked in its chamber of the turret and then to a second position which is sufficient for the turret to be rotated for coaxial alignment of the spindle with another chamber and tip. Then, the replacement tip is acquired by extending the spindle into engagement with the tip and unlocking it from its chamber of the turret. Thus, various tips for the spindle may be interchanged after placement of a component and while the spindle is being repositioned in X and Y to the next pick-up site without the need to stop at an intermediate location.

10 Claims, 3 Drawing Sheets

METHOD AND APPARATUS FOR SUPPLYING AND CHANGING TIPS OF A PICK AND PLACE VACUUM SPINDLE

BACKGROUND OF THE INVENTION

The invention is in the field of electrical component picking and placing. More particularly, the invention deals with interchangeable tips or nozzles for the vacuum spindle of a pick and place head and to an apparatus for facilitating tip changing.

It is known to provide a tool holder with replacement tips or nozzles at a location which is remote from a vacuum spindle and to move the spindle in X and Y to the holder, locate an empty pocket in the holder, deposit a tip therein from the spindle, reposition the spindle in X and Y to another pocket of the holder and fetch a replacement tip therefrom, and reposition the vacuum spindle to a pick and place working area. Thus, valuable time is lost in the steps required to change tips by means of this prior art.

It is also known, from U.S. Pat. No. 4,964,208 to provide an individual nozzle changer at each of several stations which are addressable by a vacuum spindle, by repositioning the spindle in X and Y, in order that a nozzle may be automatically attached to or detached from the spindle. Again, valuable time is lost in the steps required to change tips or nozzles.

Accordingly, it is an object of the invention to provide a pick and place spindle with interchangeable tips housed in a supply which is movable with the spindle in X and Y, with the tips being selectively separable from the supply and attachable to the spindle while the spindle is moving orthogonally in X and Y.

It is another object of the invention to provide that each tip is housed in a corresponding chamber of the supply, and that the spindle is extendable and retractable through a selected supply chamber during removal and replacement, respectively, of the corresponding tip. This eliminates the requirement and time expenditure for searching for a vacant chamber into which the component can be placed, as well as the need for a separate X-Y reorientation of the spindle relative to the supply in order to return the tip to the supply.

These and other objects of the invention will become more apparent from a study of the complete disclosure.

BRIEF SUMMARY OF THE INVENTION

A vacuum spindle for picking and placing components is operatively associated with a turret assembly which carries a supply of various component engaging tips for the spindle in corresponding holes or chambers of the turret. During picking and placing of the components, the spindle extends through the turret chamber from which the tip of the spindle was acquired. In order to exchange tips, the spindle is retracted to a first position at which the tip may be relocked in its chamber of the turret and then to a second position which is sufficient for the turret to be rotated so as to coaxially align the spindle with another chamber and tip. Then, the replacement tip is acquired by extending the spindle into engagement with it and unlocking the tip from its chamber of the turret. Thus, various tips for the spindle may be interchanged after placement of a component and while the spindle is being repositioned in X and Y to the next pick-up site.

DETAILED DESCRIPTION OF THE INVENTION

Figure 1:
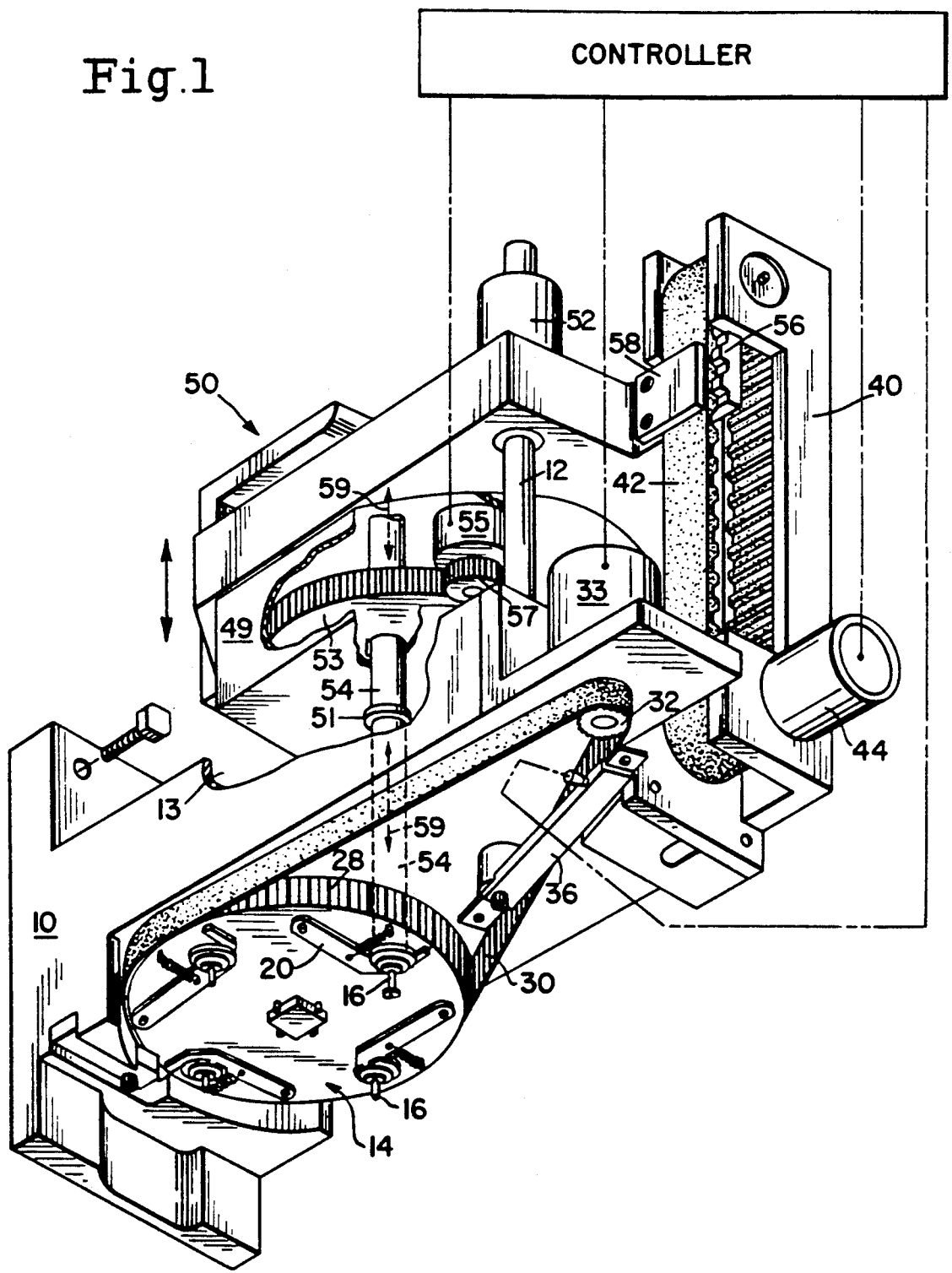
FIG. 1 is an isometric view of a pick and place spindle assembly utilizing the instant invention.
Figure 2:
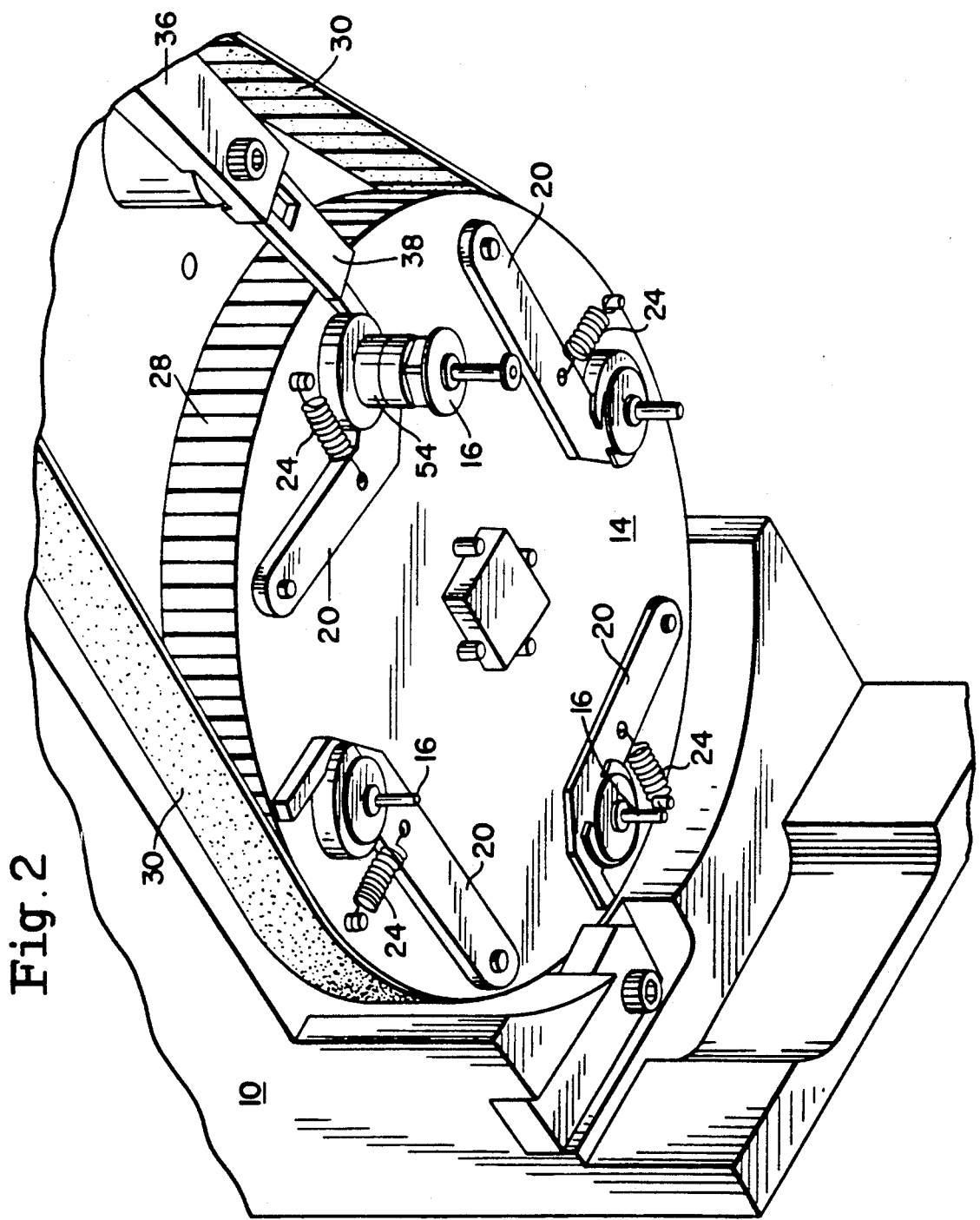
FIG. 2 is an enlarged partial isometric view of the turret assembly of FIG. 2.

Referring to FIG. 1 and 2, a main support bracket 10 is mountable on a movable cantilevered overhead arm as in U.S. Pat. No. 4,938,087 or the like so that the pick and place vacuum spindle 54 is X-Y movable between component pick-up and placement sites by X-Y repositioning of the bracket 10. Rods 12 and cooperating bearings 52 guide the spindle assembly 50 as it is reciprocated up and down along a Z-axis. In order to accomplish this up and down movement of spindle assembly 50 relative to bracket 10, an arm 56 is provided with teeth which are clamped into meshing engagement with the teeth of a timing belt 42 by a clamping plate 58. A bracket 40 is mounted to bracket 10 and supports the endless timing belt 42. Bracket 40 also supports a rotary driver 44 for imparting motion to timing belt 42 via a gear (not shown) which also meshes with timing belt 42.

Figure 3:
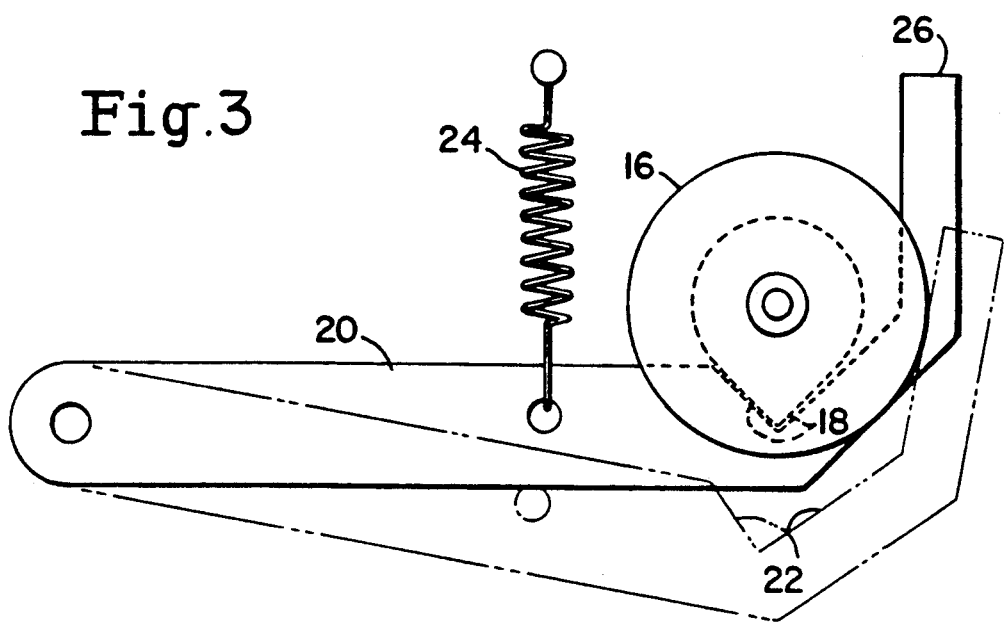
FIG. 3 is an enlarged plan view illustrating use of the tip retainer of the turret assembly.
Figure 4:
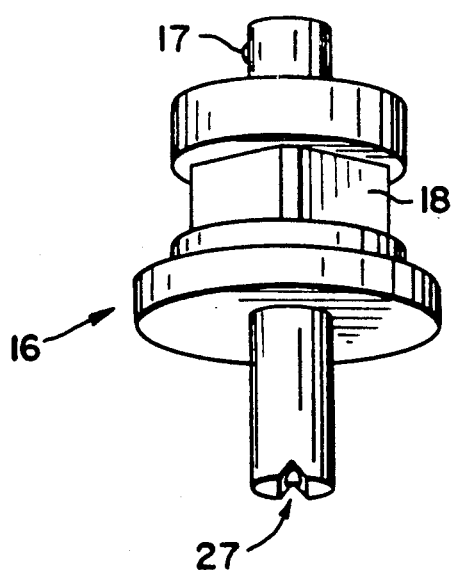
FIG. 4 is an enlarged perspective of an interchangeable tip for a vacuum spindle.
Figure 5:
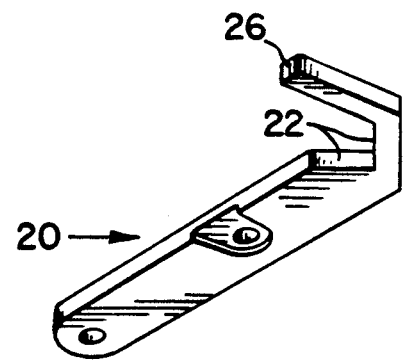
FIG. 5 is an enlarged isometric view of the retainer arm.

Bracket 10 also supports a turret 14 for rotation by a motor 33, via spur gear 32 and timing belt 30. Turret 14 has a series of chambers or holes therethrough, with each chamber being capable of housing an individual tip 16 (one of which is best seen in FIG. 4). Each chamber is addressable by vacuum spindle 54 by rotating turret 14 to align a selected chamber thereof with the spindle 54. Each tip 16 is retained in a chamber of turret 14 by means of a tip retainer 20, which is biased to a retaining position by means of spring 24. Each retainer 20 has a pair of flats 22 (FIG. 5) which mate with a corresponding pair of flats 18 (FIG. 4) of the replaceable tip 16, as best seen in FIG. 3, so as to ensure that the tip 16 is held in a particular orientation within the chamber when it is not being used by the vacuum spindle 54. In order to free a selected tip 16 for movement with the vacuum spindle 54 during picking and placing of electrical components, a so-called flat cylinder 36 is fired to extend piston 38 (best seen in FIG. 2) into engagement with the end of finger 26 of retainer 20 and to hold retainer 20 in an open position while the corresponding tip 16 is attached to and movable with vacuum spindle 54. In FIG. 2, vacuum spindle 54 is slightly extended through spindle 14 and has a tip 16 secured thereto for purposes of picking and placing components.

As seen in FIG. 4, the component engaging end of the vacuum tip 16 may have a V-shaped groove or the like in order to better control cylindrical-shaped components of the so-called "MELF" type. Tip 16 is also provided with a spring biased ball detent 17 or the like which is engagable with a corresponding groove (not shown) on the internal diameter of hollow vacuum spindle 54 to ensure attachment of tip 16 to vacuum spindle 54 prior to opening retainer 20 via cylinder 36 and piston 38.

GENERAL OPERATION

With spindle 54 initially being fully retracted along and angularly oriented about its longitudinal axis to a home position, turret 14 is rotated by motor 33, according to a programmable controller, to coaxially align a tip 16 carried in a selected chamber of turret 14 with vacuum spindle 54. In order to acquire the selected tip 16 from the turret, spindle 54 is driven downwardly until a ball detent 17 of the tip 16 engages in an internal groove (not shown) of the spindle, at which time the cylinder 36 is fired to extend piston 38 into engagement with finger 26 of retainer 20 so as to move the retainer 20 clear of the tip.

With the retainer 20 held open by piston 38, the tip 16 is free to be displaced out of its chamber of the turret by further downward movement of the spindle 54 to an operating position from which it can be lowered during picking and placing of components. During lowering of spindle 54 and tip 16 to the operating position, spindle 54 extends through the chamber of the turret 14 from which the tip was acquired (as seen in FIG. 2).

When it becomes necessary to exchange a tip 16 which is on the spindle 54 with one of the other tips carried by the turret 14, the spindle 54 is retracted back through the turret chamber until tip 16 is reseated therein, at which time the piston 38 is retracted to allow spring 24 to move retainer 20 into retaining engagement with the tip 16. After retraction of piston 38, the spindle 54 is further raised to clear turret 14 for rotation so that another tip 16 can be coaxially aligned with spindle 54, according to the programmable controller, and the tip loading sequence is repeated. If the spindle 54 has been rotated about its longitudinal (Z) axis to impart a particular orientation to a component held on tip 16, then spindle 54 is required to be reoriented about the Z axis to a "home" orientation prior to returning the tip 16 to its chamber in turret 14. Flats 18 (FIGS. 3 and 5) ensure that the tip is retained in the chamber with a particular orientation which corresponds to the "home" orientation of the spindle.

Referring to FIG. 4, the component engaging end of a tip 16 may have a V-shaped groove 27 or the like in order to handle so-called "MELF" components which are generally rod-shaped. Since this type of component is held with its length disposed parallel to that of the groove 27, it is necessary to know a reference orientation of groove 27 at time of attachment of tip 16 to spindle 54 in order that the groove 27 can be precisely reoriented, as needed, to receive the component therein during pick-up. Therefor, retainer 20 is provided with flats 22 which mate with flats 18 of tip 16 in order to maintain a particular reference orientation of the groove 27 while tip 16 is retained in its chamber of the turret 14.

Thus, it will be seen that the objects set forth above, among those made apparent from the preceding description, are efficiently attained and since certain changes may be made in the construction set forth without departing from the scope of the invention, it is intended that all matter contained in the above description or shown in the accompanying drawings shall be interpreted as illustrative and not in a limiting sense.

For instance, it is contemplated that the invention can be applied to component handling devices which hold the components by other than vacuum. It also is contemplated that the tip supply means can be a carousel with an axis which is disposed perpendicularly to the longitudinal axis of the spindle, or the supply means may be a matrix tray or the like which is shiftable in X and Y relative to the spindle in order to align the spindle with a chamber thereof. It is preferred, but not required, that the spindle passes through a chamber of the supply during acquiring and returning of the interchangeable tips in each of these applications of the invention.

It is to be understood also that the following claims are intended to cover all of the generic and specific features of the invention herein described, and all statements of the scope of the invention which, as a matter of language, might be said to fall therebetween.

Now that the invention has been described, I claim:

1. A method of providing interchangeable tips for attachment to a pick and place spindle, said spindle having a longitudinal axis situated parallel to a Z axis of an orthogonal XYZ coordinate system and being movable in X and Y directions laterally of said Z axis in order to translate said spindle between different pick-up and placement sites, and comprising the steps of:

providing an assortment of said tips and a means for storing said tips, with each said tip being stored in a distinct chamber of said storing means;

selecting a particular one of said chambers and moving said storing means laterally relative to said longitudinal axis of said spindle in order to align said axis with said particular chamber;

displacing said spindle forwardly along said longitudinal axis and into engagement with a tip stored in said particular chamber and connecting said tip to said spindle;

further displacing said spindle and connected tip forwardly along said longitudinal axis sufficiently to accomplish picking and placing of components with said tip;

displacing said spindle reversely along said longitudinal axis sufficiently to disconnect said tip from said spindle;

further displacing said spindle reversely along said longitudinal axis sufficiently to enable movement of said storing means laterally relative to said longitudinal axis;

repositioning said storing means relative to said longitudinal axis of said spindle in order to align said axis with another of said chambers in preparation for connecting another tip to said spindle;

moving said storing means together with said spindle as an entity during said translating of said spindle between said different pick-up and placement sites; and performing said repositioning of said storing means relative to the longitudinal axis of said spindle during translating of said spindle and storing means as an entity from a component placement site to a component pick-up site.

2. A method as in claim 1, and further comprising the step of:

interchanging said tips during said translating of said spindle from a component placement site to a component pick-up site.

3. A device providing interchangeable tips for a pick and place spindle, said spindle having a longitudinal axis situated parallel to a Z axis of an orthogonal XYZ coordinate system and means for moving said spindle in X and Y directions laterally of said Z axis in order to translate said spindle between different pick-up and placement sites, and comprising:

means for storing an assortment of said tips, with each said tip being stored in a distinct chamber of said storing means;

means for selectively moving said storing means laterally relative to said longitudinal axis of said spindle in order to align said axis with a particular one of said chambers;

means for displacing said spindle forwardly along said longitudinal axis and into engagement with a tip stored in said particular chamber;

means for connecting said tip to said spindle;

means for further displacing said spindle and connected tip forwardly along said longitudinal axis sufficiently to accomplish picking and placing of components with said tip;

means for displacing said spindle reversely along said longitudinal axis sufficiently to disconnect said tip from said spindle and restore said tip in said particular chamber;

means for further displacing said spindle reversely along said longitudinal axis sufficiently to enable movement of said storing means laterally relative to said longitudinal axis;

means for repositioning said storing means laterally relative to said longitudinal axis of said spindle in order to align said spindle with another of said chambers in preparation for connecting another tip to said spindle;

said storing means and said spindle being movable as an entity during said translating of said spindle between said different pick-up and placement sites; and means for performing said repositioning of said storing means relative to the longitudinal axis of said spindle during translating of said spindle and storing means as an entity from a component placement site to a component pick-up site.

4. A device as in claim 3, and further comprising:
means for interchanging said tips on said spindle during said translating of said spindle from a component placement site to a component pick-up site.

5. A device as in claim 3, wherein:
said storing means comprises a rotatable turret; and
said moving means comprises means for rotating said turret.

6. A device as in claim 3, wherein said turret comprises:
an axis of rotation which is disposed parallel to said longitudinal axis.

7. A device as in claim 3, and further comprising:
means for retaining said tips in said chambers; and
means for opening said retaining means in order to remove a tip therefrom.

8. A device as in claim 7, and further comprising:
means for insuring a particular orientation of said tips in said chambers.

9. A device providing interchangeable tips for a pick and place spindle, said spindle having a longitudinal axis situated parallel to a Z axis of an orthogonal XYZ coordinate system and means for moving said spindle in X and Y directions laterally of said Z axis in order to translate said spindle between different pick-up and placement sites, and comprising:

means for storing an assortment of said tips, with each said tip being stored in a distinct chamber of said storing means;

means for selectively moving said storing means laterally relative to said longitudinal axis of said spindle in order to align said axis with a particular one of said chambers;

means for displacing said spindle forwardly along said longitudinal axis and into engagement with a tip stored in said particular chamber;

means for connecting said tip to said spindle;

means for further displacing said spindle and connected tip forwardly along said longitudinal axis sufficiently to accomplish picking and placing of components with said tip;

means for displacing said spindle reversely along said longitudinal axis sufficiently to disconnect said tip from said spindle and restore said tip in said particular chamber;

means for further displacing said spindle reversely along said longitudinal axis sufficiently to enable movement of said storing means laterally relative to said longitudinal axis;

means for repositioning said storing means laterally relative to said longitudinal axis of said spindle in order to align said spindle with another of said chambers in preparation for connecting another tip to said spindle;

means for retaining said tips in said chambers and comprising a keeper corresponding individually to and situated adjacent each said chamber, each said keeper being pivotally attached to said storing means and having a free end biased toward the corresponding chamber in order to engage a shank portion of a bit and retain the bit in the chamber;

means for opening said retaining means in order to remove a tip therefrom and comprising a cylinder situated adjacent said storing means and selectively actuatable in order to extend a piston thereof into engagement with the keeper corresponding to said particular chamber and pivot said free end away said particular chamber and clear of the tip corresponding to said particular chamber; and said storing means and said spindle being movable as an entity during said translating of said spindle between said different pick-up and placement sites.

10. A device providing interchangeable tips for a pick and place spindle, said spindle having a longitudinal axis situated parallel to a Z axis of an orthogonal XYZ coordinate system and means for moving said spindle in X and Y directions laterally of said Z axis in order to translate said spindle between different pick-up and placement sites, and comprising:

means for storing an assortment of said tips, with each said tip being stored in a distinct chamber of said storing means;

means for selectively moving said storing means laterally relative to said longitudinal axis of said spindle in order to align said axis with a particular one of said chambers;

means for displacing said spindle forwardly along said longitudinal axis and into engagement with a tip stored in said particular chamber;

means for connecting said tip to said spindle;

means for further displacing said spindle and connected tip forwardly along said longitudinal axis sufficiently to accomplish picking and placing of components with said tip;

means for displacing said spindle reversely along said longitudinal axis sufficiently to disconnect said tip from said spindle and restore said tip in said particular chamber;

means for further displacing said spindle reversely along said longitudinal axis sufficiently to enable movement of said storing means laterally relative to said longitudinal axis;

means for repositioning said storing means laterally relative to said longitudinal axis of said spindle in order to align said spindle with another of said chambers in preparation for connecting another tip to said spindle;

means for moving said storing means and said spindle as an entity during said translating of said spindle between said different pick-up and placement sites;

means for retaining said tips in said chambers;

means for opening said retaining means in order to remove a tip therefrom; and means for insuring a particular orientation of said tips in said chambers and comprising at least one flat surface on an outer diameter of a shank portion of each of said tips and at least one flat surface on a keeper and mateable with said shank portion flat surface when said tip is situated in said chamber and said keeper is in an open state, so as to register and retain a particular angular orientation of a tip within said chamber which orientation corresponds to a home position of angular rotation of said spindle.

* * * * *